United States Patent
Hayashi et al.

(10) Patent No.: US 10,680,402 B2
(45) Date of Patent: Jun. 9, 2020

(54) LIGHT-EMITTING DEVICE

(71) Applicant: TOYODA GOSEI CO., LTD., Kiyosu-shi (JP)

(72) Inventors: Kento Hayashi, Kiyosu (JP); Satoshi Wada, Kiyosu (JP); Yuhki Kawamura, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 16/297,299

(22) Filed: Mar. 8, 2019

(65) Prior Publication Data
US 2019/0288482 A1    Sep. 19, 2019

(30) Foreign Application Priority Data
Mar. 15, 2018    (JP) .................................. 2018-048622

(51) Int. Cl.
*H01S 5/00* (2006.01)
*H01S 5/022* (2006.01)
*H01S 5/40* (2006.01)

(52) U.S. Cl.
CPC .......... *H01S 5/02288* (2013.01); *H01S 5/022* (2013.01); *H01S 5/02296* (2013.01); *H01S 5/4093* (2013.01); *H01S 5/0078* (2013.01); *H01S 5/02208* (2013.01); *H01S 5/02292* (2013.01); *H01S 5/4087* (2013.01)

(58) Field of Classification Search
CPC .... H01S 5/022; H01S 5/4093; H01S 5/02288; H01S 5/02292; H01S 5/02296; H01S 5/0078; H01S 5/4087
See application file for complete search history.

(56) References Cited

U.S. PATENT DOCUMENTS

| | | | |
|---|---|---|---|
| 5,535,230 A * | 7/1996 | Abe .......................... | F21K 9/69 250/504 R |
| 2004/0182929 A1* | 9/2004 | Aoshima ............. | H01S 3/09415 235/454 |
| 2013/0002972 A1* | 1/2013 | Tanaka ............... | G02B 27/1046 349/8 |

(Continued)

FOREIGN PATENT DOCUMENTS

CN    106939983 A    7/2017
JP    H 07-282609 A    10/1995

(Continued)

OTHER PUBLICATIONS

Chinese Office Action, dated Mar. 27, 2020, in Chinese Application No. 201910188788.6 and English Translation thereof.

*Primary Examiner* — Kinam Park
(74) *Attorney, Agent, or Firm* — McGinn IP Law Group, PLLC

(57) ABSTRACT

Provided is a light-emitting device having low angle dependence of chromaticity as well as achieving wide-angle light distribution. The light-emitting device has a semiconductor laser diode, a first lens, a second lens, and a wavelength converting part for converting the wavelength of the laser beam emitted from the semiconductor laser diode. The first lens has a first spread angle and refracts the laser beam emitted from the semiconductor laser diode. The second lens has a second spread angle and refracts the laser beam refracted by the first lens. The second spread angle is larger than the first spread angle.

7 Claims, 7 Drawing Sheets

(56) References Cited

U.S. PATENT DOCUMENTS

2013/0335710 A1* 12/2013 Okamoto .................. G02F 1/29
                                                    353/30
2017/0363269 A1* 12/2017 Sano ....................... H01S 5/005
2018/0216811 A1*  8/2018 Fukakusa ................ F21V 13/08

FOREIGN PATENT DOCUMENTS

| JP | 2007-115933 A | 5/2007 |
| JP | 2018-006133 A | 1/2018 |

* cited by examiner

LIGHT-EMITTING DEVICE

BACKGROUND OF THE INVENTION

Field of the Invention

The present techniques relate to a light-emitting device.

Background Art

A semiconductor laser diode may be used in a light-emitting device. The semiconductor laser diode has high directivity. Therefore, when the semiconductor laser diode is used as a light source, a laser beam may be used after diffusing the laser beam.

For example, Japanese Patent Application Laid-Open (kokai) No. H07-282609 discloses an illuminating light source device comprising a group of semiconductor laser elements for respectively outputting laser beams of red, green, and blue, and a diffusion lens 3 for diffusing the laser beam from each of the semiconductor laser elements. The illuminating light source device also has a condensing diffusion lens 9 on which the diffused laser beams of red, green, and blue are integrated. The illuminating light source device provides white light by integrating the laser beams of red, green, and blue with the condensing diffusion lens 9.

Generally, the laser beam has a narrow spread angle. In the light-emitting device, the laser beam having a narrow spread angle is scattered by the wavelength converting part or the scattering part. However, the laser beam transmitted through the wavelength converting part or the scattering part does not have so wide-angle light distribution. On the other hand, the laser beam wavelength-converted by a fluorescent substance or the like shows Lambert distribution, i.e., luminance distribution without angle dependency (isotropic luminance distribution). In this way, the transmitted laser beam and the wavelength converted laser beam have different light distributions. Chromaticity varies with the angle to the light extraction direction by integrating the transmitted laser beam and the wavelength converted laser beam. That is, angle dependence of chromaticity is suppressed.

SUMMARY OF THE INVENTION

The present techniques have been conceived for solving the aforementioned problems involved in conventional techniques. Thus, an object of the present techniques is to provide a light-emitting device having low angle dependence of chromaticity as well as achieving wide-angle light distribution.

In a first aspect of the present techniques, there is provided a light-emitting device comprising a semiconductor laser diode, a first lens for making a laser beam emitted from the semiconductor laser diode incident, a second lens for making a laser beam emitted from the first lens incident, and a wavelength converting part for converting the wavelength of the laser beam emitted from the semiconductor laser diode. The first lens has a first spread angle θ1 and refracts the laser beam emitted from the semiconductor laser diode. The second lens has a second spread angle θ2 and refracts a laser beam refracted by the first lens. The second spread angle θ2 is larger than the first spread angle θ1.

The light-emitting device has a first lens with a first spread angle θ1 and a second lens with a second spread angle θ2. The second spread angle θ2 is larger than the first spread angle θ1. Therefore, the laser beam before incident on the wavelength converting part can be further diffused because the transmitted laser beam has a large spread angle. Thereby, angle dependence of chromaticity is suppressed in the light-emitting device. That is, more uniform chromaticity is realized in the light-emitting device.

The present techniques, disclosed in the specification, provide a light-emitting device having low angle dependence of chromaticity as well as achieving wide-angle light distribution.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

With reference to the drawings, specific embodiment of the light-emitting device as an example will next be described in detail. However, these embodiments should not be construed as limiting the techniques thereto.

First Embodiment

1. Light-Emitting Device

Figure 1:
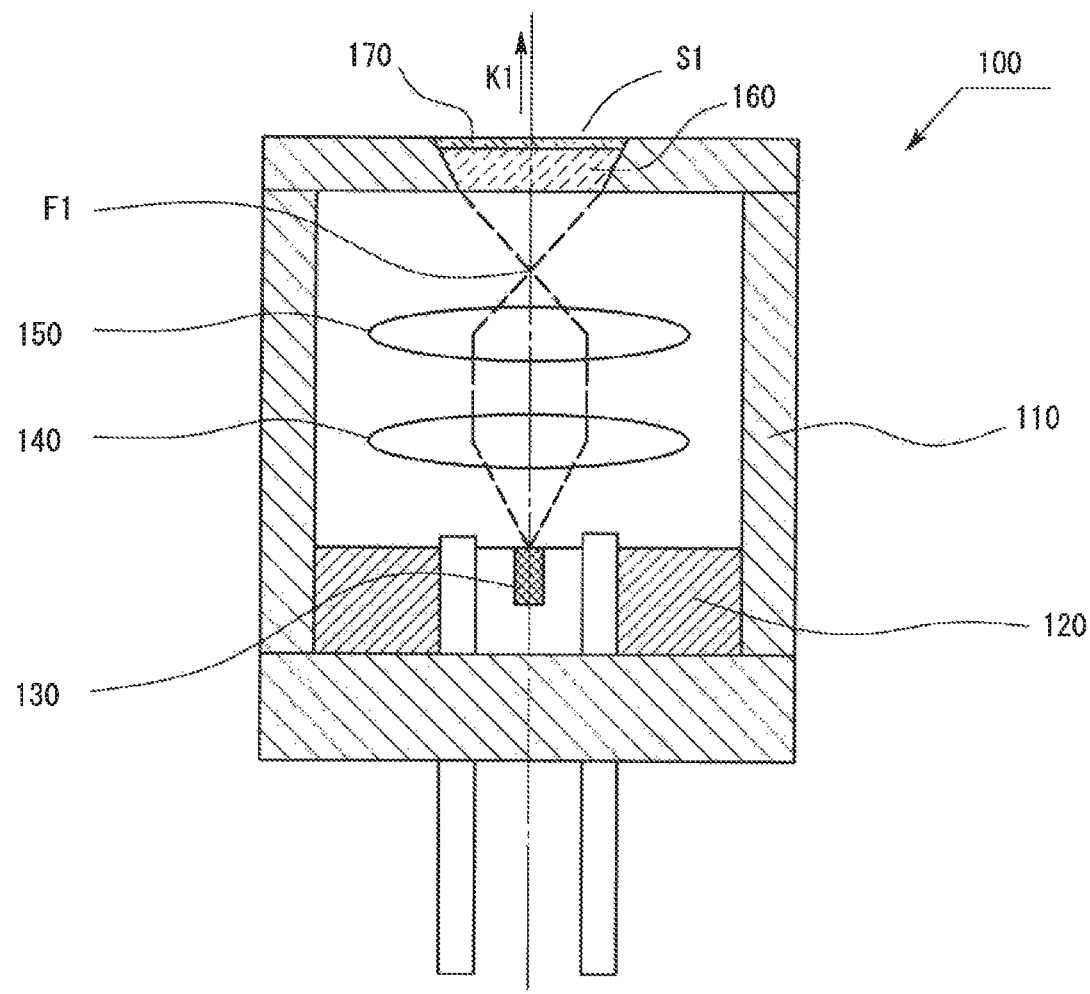
FIG. 1 is a schematic view of the structure of a light-emitting device according to the first embodiment.

FIG. 1 is a schematic view of the structure of a light-emitting device 100 according to the first embodiment. As shown in FIG. 1, the light-emitting device 100 comprises a case 110, a mounting substrate 120, a semiconductor laser diode 130, a first lens 140, a second lens 150, a wavelength converting part 160, and a scattering part 170. The light-emitting device 100 has a light emission surface S1. The light emission surface S1 is a surface for extracting the light emitted from the light-emitting device 100 to the outside. The light emission surface S1 emits the laser beam emitted from the semiconductor laser diode 130. The light extraction direction K1 is perpendicular to the light emission surface S1. The light extraction direction K1 is parallel to the emitting direction of the laser beam emitted from the semiconductor laser diode 130.

The case 110 houses the mounting substrate 120, the semiconductor laser diode 130, the first lens 140, the second lens 150, the wavelength converting part 160, and the scattering part 170.

The mounting substrate 120 is a substrate for mounting the semiconductor laser diode 130. The mounting substrate 120 has the semiconductor laser diode 130.

The semiconductor laser diode 130 emits the laser beam passing through the first lens 140 and the second lens 150 and being incident on the wavelength converting part 160. The semiconductor laser diode 130 emits a blue laser beam.

The first lens 140 is used for refracting the laser beam emitted from the semiconductor laser diode 130. The first lens 140 is a collimator that converts the laser beam from the semiconductor laser diode 130 to a collimate light.

The second lens 150 is used for refracting the laser beam emitted from the semiconductor laser diode 130. The second lens 150 refracts the laser beam converted to a collimate light by the first lens 140 and makes it incident on the wavelength converting part 160.

The wavelength converting part 160 is used for converting the wavelength of the laser beam emitted from the semiconductor laser diode 130. Actually, the laser beam condensed by the second lens 150 is incident on the wavelength converting part 160. The wavelength converting part 160 has, for example, fluorescent material and resin. The wavelength converting part 160 also plays the role of scattering the laser beam emitted from the semiconductor laser diode 130. The wavelength converting part 160 is disposed in a position farther than the scattering part 170 viewing from the light emission surface S1.

The scattering part 170 is used for scattering the laser beam emitted from the semiconductor laser diode 130. Actually, the scattering part 170 scatters the laser beam passed through the wavelength converting part 160.

2. First Lens and Second Lens

As shown in FIG. 1, the first lens 140, the second lens 150, the wavelength converting part 160, and the scattering part 170 are disposed in this order from the side of the semiconductor laser diode 130. The first lens 140 is disposed between the semiconductor laser diode 130 and the second lens 150. The second lens 150 is disposed between the first lens 140 and the wavelength converting part 160. In this way, the first lens 140 is disposed on the upstream side of a path of the laser beam than the second lens 150.

The first lens 140 has a first spread angle θ1. The second lens 150 has a second spread angle θ2. The second spread angle θ2 of the second lens 150 is larger than the first spread angle θ1 of the first lens 140. That is, the second spread angle θ2 satisfies the following formula.

$$\theta 2 > \theta 1 \quad (1)$$

θ1: first spread angle of first lens
θ2: second spread angle of second lens

The first spread angle θ1 of the first lens 140 and the second spread angle θ2 of the second lens 150 more preferably satisfy the following formula.

$$1° \leq \theta 2 - \theta 1 \leq 15° \quad (2)$$

The second lens 150 faces the wavelength converting part 160. The focal point F1 of the second lens 150 is disposed between the second lens 150 and the wavelength converting part 160. The focal point F1 is preferably in a position closer to the second lens 150 than the wavelength converting part 160. The spread angle of the laser beam incident on the wavelength converting part 160 is the same as the second spread angle θ2 because the laser beam incident on the wavelength converting part 160 has already been spread to a certain level.

3. Light From Semiconductor Laser Diode

The laser beam emitted from the semiconductor laser diode 130 is incident on the first lens 140 and converted to a collimate light. The laser beam converted to a collimate light is incident on the second lens 150 and refracted. The laser beam is incident on the wavelength converting part 160 at a sufficient spread angle θ2 because the second spread angle θ2 of the second lens 150 is sufficiently wide.

A part of the laser beam incident on the wavelength converting part 160 is transmitted therethrough. The remaining part of the laser beam incident on the wavelength converting part 160 is wavelength-converted and scattered. The transmitted light and the wavelength-converted light are integrated to emit a white light. Here, the transmitted light has a sufficiently wide spread angle. The wavelength-converted light has a Lambert light distribution. Therefore, the light obtained by integrating the transmitted light and the wavelength-converted light has low angle dependence.

Since the transmitted light has a sufficiently large spread angle, an emitting light having wide-angle light distribution is obtained. That is, the light-emitting device 100 can emits a light having low angle dependence of chromaticity as well as having wide-angle light distribution.

4. Simulation

Figure 2:
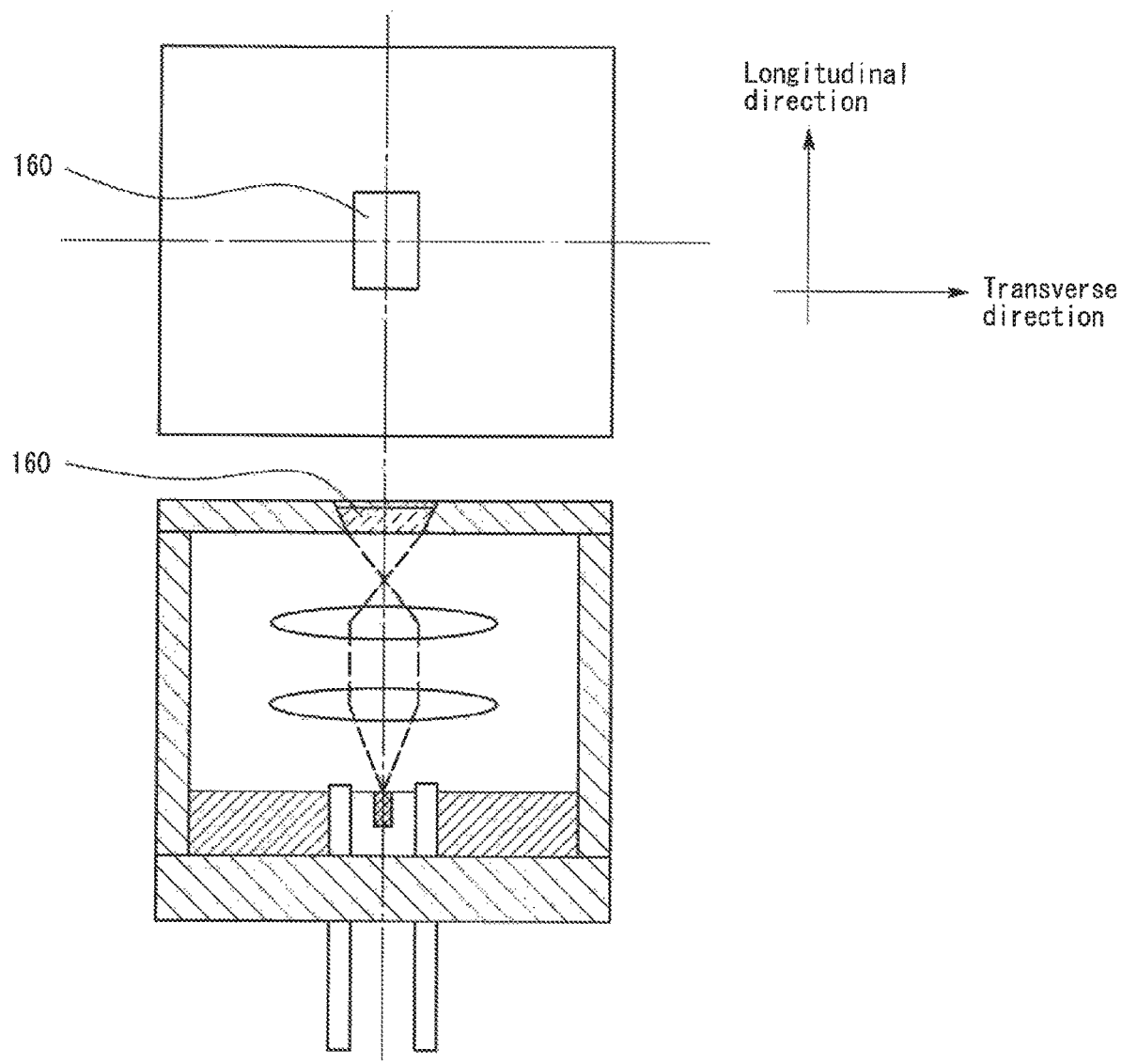
FIG. 2 is a view for explaining a simulation model according to the first embodiment.

FIG. 2 is a view for explaining a simulation model according to the first embodiment. As shown in FIG. 2, the wavelength converting part 160 has a rectangle shape. Therefore, in simulation, the longitudinal direction of the wavelength converting part 160 and the transverse direction of the wavelength converting part 160 are set.

Figure 3:
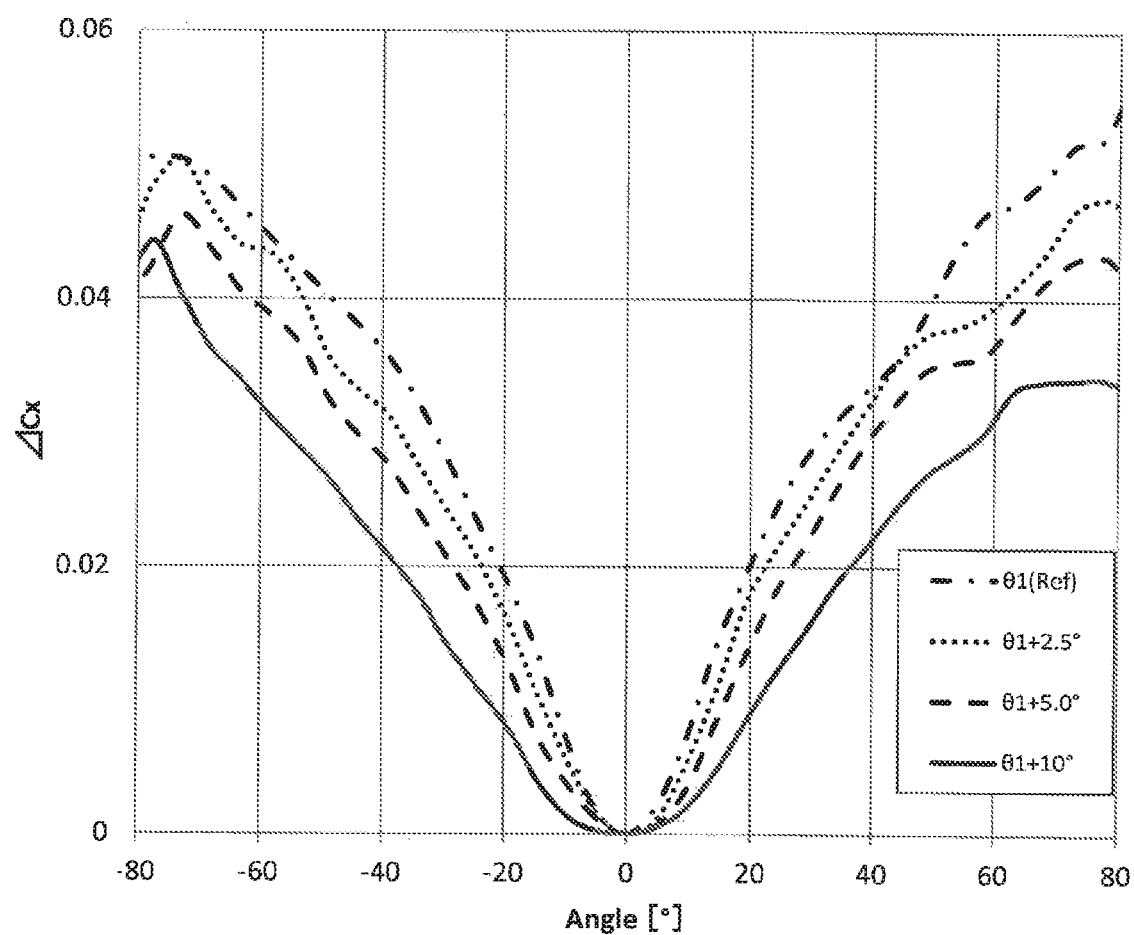
FIG. 3 is a graph showing chromaticity difference ΔCx to the angle in a longitudinal direction of the simulation model.
Figure 4:
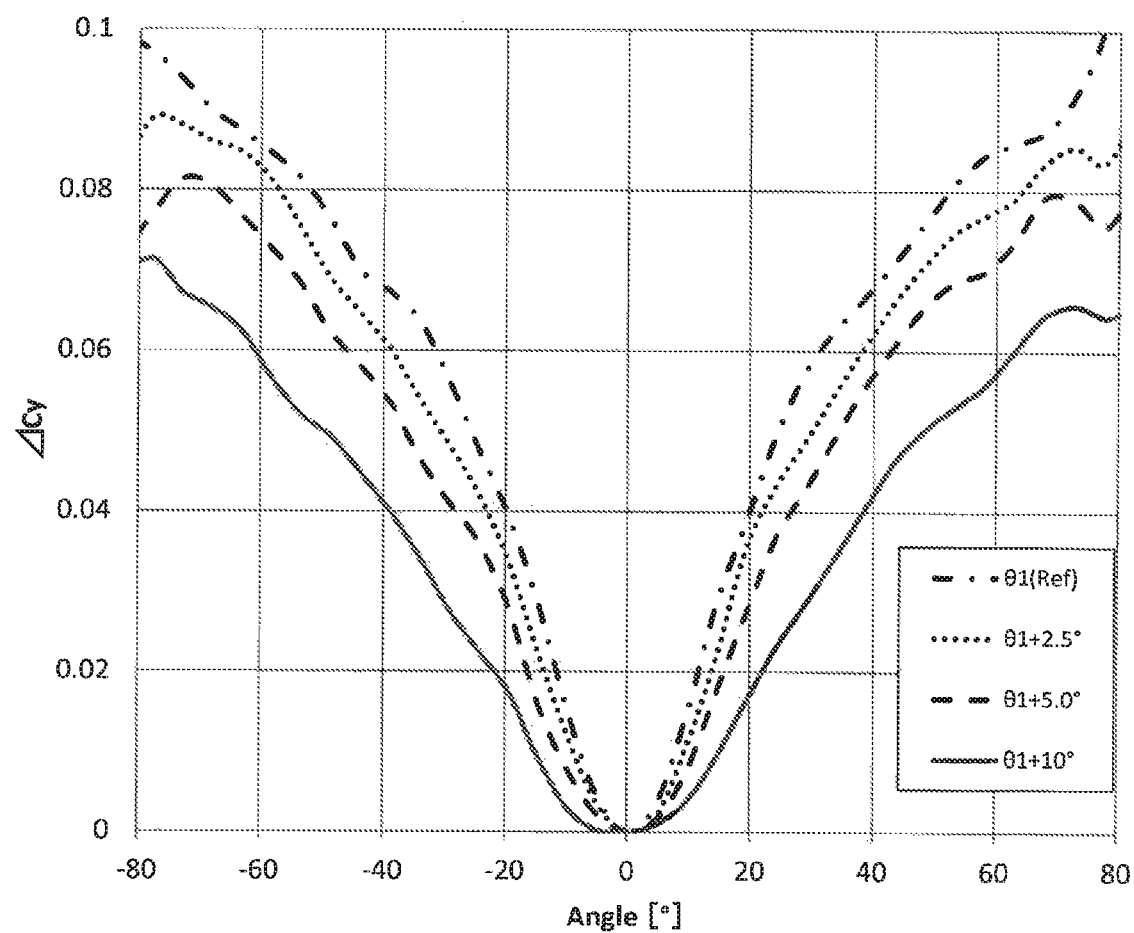
FIG. 4 is a graph showing chromaticity difference ΔCy to the angle in a longitudinal direction of the simulation model.
Figure 5:
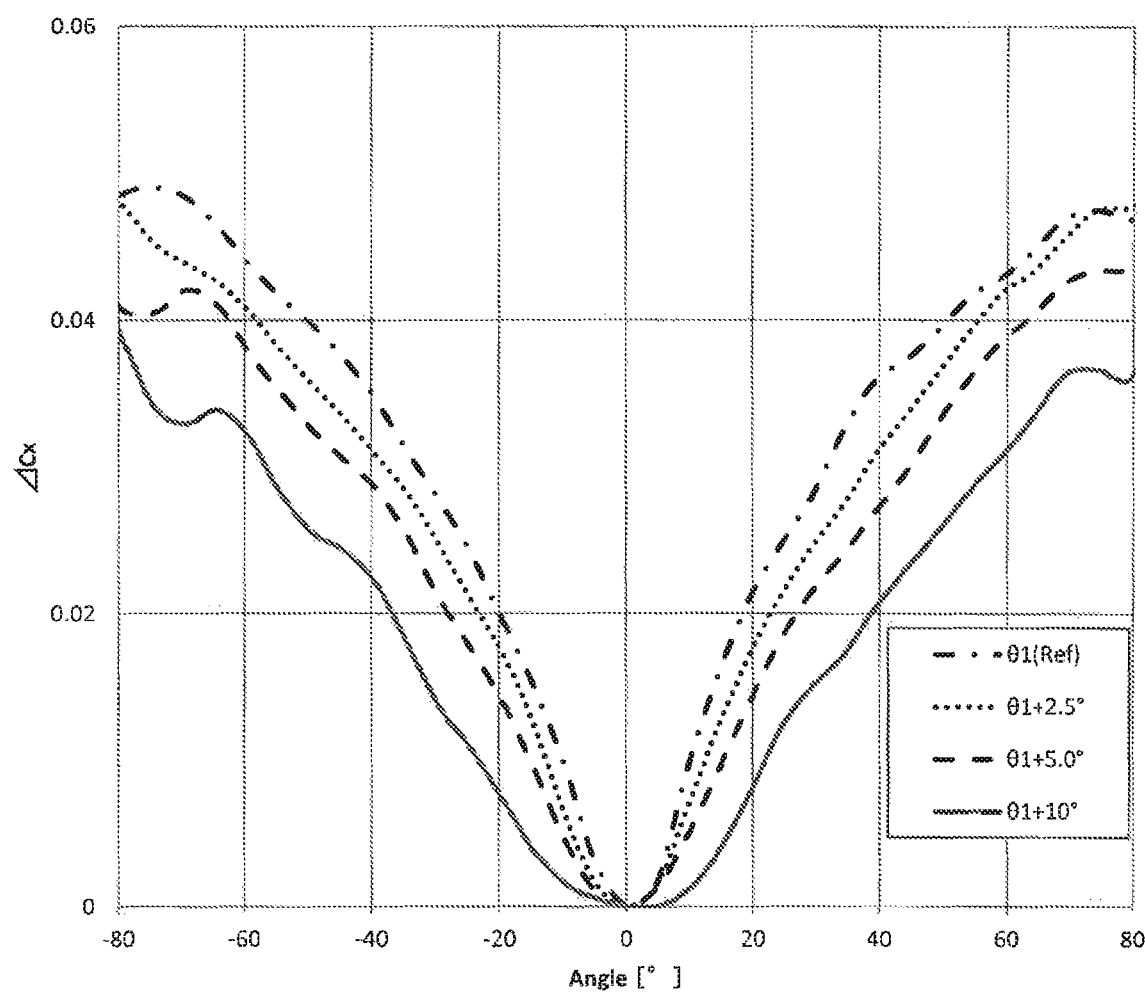
FIG. 5 is a graph showing chromaticity difference ΔCx in a transverse direction of the simulation model.
Figure 6:
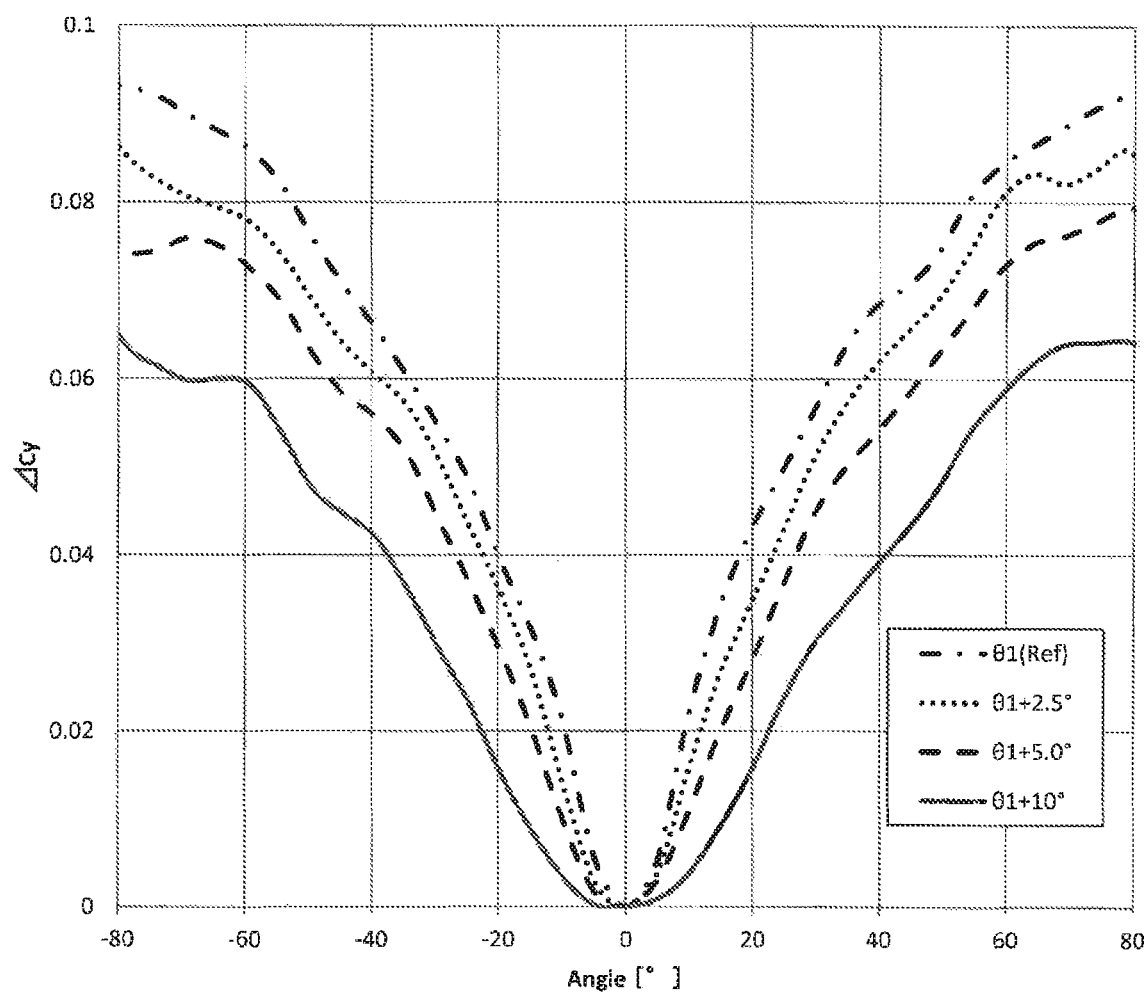
FIG. 6 is a graph showing chromaticity difference ΔCy in a transverse direction of the simulation model.

FIGS. 3 to 6 are graphs showing the simulation results. FIG. 3 is a graph showing chromaticity difference ΔCx to the angle in the longitudinal direction of the simulation model. FIG. 4 is a graph showing chromaticity difference ΔCy to the angle in the longitudinal direction of the simulation model. (x, y) represents a chromaticity coordinate. ΔCx represents x component of chromaticity difference, and ΔCy represents y component of chromaticity difference. FIG. 5 is a graph showing chromaticity difference ΔCx in the transverse direction of the simulation model. FIG. 6 is a graph showing chromaticity difference ΔCy in the transverse direction of the simulation model.

The horizontal axes of FIGS. 3 to 6 indicate angles to the light extraction direction K1. The vertical axes of FIGS. 3 and 5 indicate chromaticity differences ΔCx. The vertical axes of FIGS. 4 and 6 indicate chromaticity differences ΔCy. In FIGS. 3 to 6, a dashed line, a dotted line, a broken line, and a solid line are drawn. The dashed line indicates the case where θ2−θ1=0°. The dotted line indicates the case where θ2−θ1=2.5°. The broken line indicates the case where θ2−θ1=5.0°. The solid line indicates the case where θ2−θ1=10°.

FIGS. 3 to 6 show how much the chromaticity varies relative to the light extraction direction K1. When the chromaticity at a certain angle θa is equal to the chromaticity in the light extraction direction K1, the chromaticity difference ΔCx and the chromaticity difference ΔCy at the angle θa are 0 (zero). The larger the difference between the chromaticity at a certain angle θa and the chromaticity in the light extraction direction K1, the larger the chromaticity difference ΔCx and the chromaticity difference ΔCy. Therefore, the chromaticity difference ΔCx and the chromaticity difference ΔCy are preferably close to 0 (zero). As a result, the lights having close chromaticities are emitted in all directions.

As shown in FIGS. 3 to 6, there is a tendency that the larger the angle to the light extraction direction K1, the larger the chromaticity difference ΔCx and the chromaticity difference ΔCy.

The following relationship exists between the first spread angle θ1 and the second spread angle θ2. In any cases where θ2−θ1 is 2.5°, 5.0°, and 10°, the chromaticity differences ΔCx and ΔCy are smaller than the case where θ2−θ1 is 0°. That is, when the formula (2) is satisfied, the chromaticity difference ΔCx and the chromaticity difference ΔCy are small. When the formula (2) is satisfied, angle dependence of chromaticity is suppressed.

5. Effect of First Embodiment

The light-emitting device 100 according to the first embodiment has a first lens 140 with a first spread angle θ1 and a second lens 150 with a second spread angle θ2. The second spread angle θ2 is larger than the first spread angle θ1. Therefore, the laser beam before incident on the wavelength converting part 160 can be further scattered because the transmitted laser beam has a large spread angle. Thereby, angle dependence of chromaticity in the light-emitting device 100 is suppressed. That is, more uniform chromaticity is realized in the light-emitting device.

6. Variations

6-1. Scattering Part

The scattering part 170 may be disposed on the light incident side of the wavelength converting part 160. In this case, the scattering part 170 is disposed between the second lens 150 and the wavelength converting part 160. The laser beam emitted from the semiconductor laser diode 130 is transmitted through the first lens 140 and the second lens 150, scattered by the scattering part 170, and then incident on the wavelength converting part 160.

6-2. Wavelength Selection Member

A wavelength selection member may be provided between the second lens 150 and the wavelength converting part 160. The wavelength selection member preferably transmits a blue laser beam and reflects a laser beam with a wavelength longer than the wavelength of the blue laser beam. The laser beam with a longer wavelength scattered by the wavelength converting part 160 and the scattering part 170 can be prevented from being directed toward the second lens 150.

6-3. First Lens

The first lens 140 is not necessarily a collimator.

6-4. Combinations

The aforementioned variations may be combined with one another without any restriction.

7. Summary of First Embodiment

The light-emitting device 100 according to the first embodiment has a first lens 140 with a first spread angle θ1 and a second lens 150 with a second spread angle θ2. The second spread angle θ2 is larger than the first spread angle θ1. Therefore, laser beam before incident on the wavelength converting part 160 can be further spread because the transmitted laser beam has a large spread angle. Thereby, angle dependence of chromaticity in the light-emitting device 100 is suppressed. That is, more uniform chromaticity is realized in the light-emitting device.

Second Embodiment

The second embodiment will be described.

Figure 7:
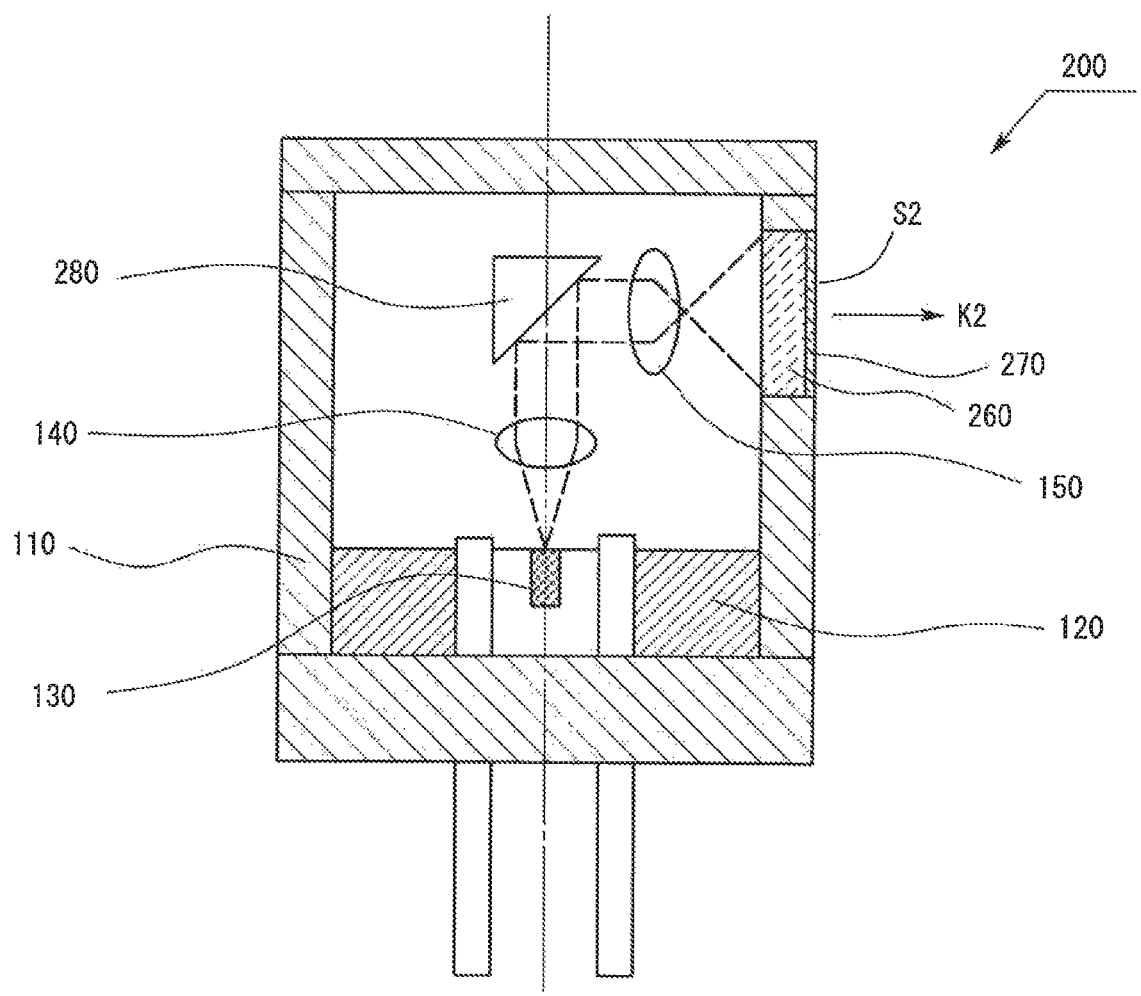
FIG. 7 is a schematic view of the structure of a light-emitting device according to the second embodiment.

FIG. 7 is a schematic view of the structure of a light-emitting device 200 according to the second embodiment. As shown in FIG. 7, the light-emitting device 200 has a case 110, a mounting substrate 120, a semiconductor laser diode 130, a first lens 140, a second lens 150, a wavelength converting part 260, a scattering part 270, and a mirror 280. The light-emitting device 200 has a light emission surface S2. The light emission surface S2 is a surface for extracting the light from the light-emitting device 200 to the outside. The light emission surface S2 emits the laser beam emitted from the semiconductor laser diode 130. The light extraction direction K2 is perpendicular to the light emission surface S2. The light extraction direction K2 is perpendicular to the emitting direction of the laser beam emitted from the semiconductor laser diode 130.

The mirror 280 reflects the laser beam refracted by the first lens 140, and makes the reflected laser beam incident on the second lens 150. More specifically, the mirror 280 reflects the laser beam converted into a collimate light by the first lens 140 at an angle of 90°. For that, the light emission surface S2 does not face the light emission part of the semiconductor laser diode 130.

The laser beam emitting toward the light extraction direction K2 is not a light directly emitted from the semiconductor laser diode 130. Therefore, it is safe for human beings.

A. Note

In a first aspect of the present techniques, there is provided a light-emitting device having a semiconductor laser diode, a first lens, a second lens, and a wavelength converting part for converting the wavelength of the laser beam emitted from the semiconductor laser diode. The first lens has a first spread angle θ1 and refracts the laser beam emitted from the semiconductor laser diode. The second lens has a second spread angle θ2 and refracts the laser beam refracted by the first lens. The second spread angle θ2 is larger than the first spread angle θ1.

A second aspect of the techniques is directed to a specific embodiment of the light-emitting device, wherein the first spread angle θ1 and the second spread angle θ2 satisfy the following formula.

$$1° \leq θ2-θ1 \leq 15°$$

A third aspect of the techniques is directed to a specific embodiment of the light-emitting device, wherein the light-emitting device has a mirror. The mirror reflects the laser beam refracted by the first lens, and makes the reflected laser beam incident on the second lens.

A fourth aspect of the techniques is directed to a specific embodiment of the light-emitting device, wherein a wavelength selection member is provided between the second lens and the wavelength converting part.

What is claimed is:
1. A light-emitting device comprising:
   a semiconductor laser diode;
   a first lens for making a laser beam emitted from the semiconductor laser diode incident;

a second lens for making a laser beam emitted from the first lens incident; and a wavelength converting part for converting the wavelength of the laser beam emitted from the semiconductor laser diode, wherein the first lens has a first spread angle θ1 and refracts the laser beam emitted from the semiconductor laser diode;

the second lens has a second spread angle θ2 and refracts a laser beam refracted by the first lens; and the second spread angle θ2 is larger than the first spread angle θ1.

2. The light-emitting device according to claim 1, wherein the first spread angle θ1 and the second spread angle θ2 satisfy the following formula:

$1° \leq θ2-θ1 \leq 15°$.

3. The light-emitting device according to claim 1, wherein the light-emitting device has a mirror; and the mirror reflects the laser beam refracted by the first lens, and makes the reflected laser beam incident on the second lens.

4. The light-emitting device according to claim 2, wherein the light-emitting device has a mirror; and the mirror reflects the laser beam refracted by the first lens, and makes the reflected laser beam incident on the second lens.

5. The light-emitting device according to claim 1, wherein a wavelength selection member is provided between the second lens and the wavelength converting part.

6. The light-emitting device according to claim 2, wherein a wavelength selection member is provided between the second lens and the wavelength converting part.

7. The light-emitting device according to claim 3, wherein a wavelength selection member is provided between the second lens and the wavelength converting part.

* * * * *